United States Patent
Chen

(10) Patent No.: US 9,590,671 B2
(45) Date of Patent: Mar. 7, 2017

(54) DETECTOR GENERATING A DISPLACEMENT SIGNAL BY INJECTION LOCKING AND INJECTION PULLING

(71) Applicant: RichWave Technology Corp., Taipei (TW)

(72) Inventor: Tse-Peng Chen, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 15/076,685

(22) Filed: Mar. 22, 2016

(65) Prior Publication Data

US 2016/0301433 A1 Oct. 13, 2016

(30) Foreign Application Priority Data

Apr. 8, 2015 (TW) .............................. 104111323 A

(51) Int. Cl.
| | | |
|---|---|---|
| H04B 1/38 | (2015.01) | |
| H04L 5/16 | (2006.01) | |
| H04B 1/10 | (2006.01) | |
| H04L 1/00 | (2006.01) | |
| H03L 7/099 | (2006.01) | |
| H03L 7/08 | (2006.01) | |

(52) U.S. Cl.
CPC .............. *H04B 1/10* (2013.01); *H03L 7/0802* (2013.01); *H03L 7/099* (2013.01); *H04L 1/0053* (2013.01)

(58) Field of Classification Search
CPC ......... H04B 1/10; H04L 1/0053; H03L 7/099; H03L 7/0802; H03D 3/006
USPC ............................. 375/219, 220, 222; 331/2
See application file for complete search history.

(56) References Cited

U.S. PATENT DOCUMENTS

| | | | | |
|---|---|---|---|---|
| 6,360,087 | B1 * | 3/2002 | Rozenblit | .............. H03D 3/006 331/2 |
| 2002/0039039 | A1 | 4/2002 | Maligeorgos | |
| 2010/0214172 | A1 | 8/2010 | Yeh | |

FOREIGN PATENT DOCUMENTS

| | | |
|---|---|---|
| JP | 2014168220 | 9/2014 |
| TW | 201126894 | 8/2011 |
| TW | 201312951 | 3/2013 |

(Continued)

OTHER PUBLICATIONS

Yu-Cheng Lai; "Modeling of the Oscillator Pulling Effects within a Phase-Locked Loop"; master's thesis; Graduate Institute of Computer and Communication Engineering; National Taipei University of Technology;Jul. 2013.

*Primary Examiner* — Phuong Phu
(74) *Attorney, Agent, or Firm* — Winston Hsu; Scott Margo

(57) ABSTRACT

A detector includes an oscillation source, a frequency multiplier, a transceiver and a demodulator. The oscillation source generates a first injection signal with a first frequency. The frequency multiplier receives the first injection signal, outputs an output signal and receives a second injection signal with a second frequency. The frequency multiplier uses injection locking to lock a frequency of the output signal at a multiple of the first frequency, and uses injection pulling to pull the frequency of the output signal to the second frequency. The transceiver transmits the output signal and receives a received signal with a third frequency for updating the second injection signal. The demodulator performs a demodulation operation according to the output signal so as to generate a displacement signal.

13 Claims, 11 Drawing Sheets

(56) References Cited

FOREIGN PATENT DOCUMENTS

| | | |
|---|---|---|
| TW | 201428325 | 7/2014 |
| TW | 201448478 | 12/2014 |
| WO | 2015042814 A1 | 4/2015 |

* cited by examiner

DETECTOR GENERATING A DISPLACEMENT SIGNAL BY INJECTION LOCKING AND INJECTION PULLING

CROSS REFERENCE TO RELATED APPLICATION

This application claims priority to Taiwan Patent Application No. 104111323, filed Apr. 8, 2015, and incorporated herein by reference in its entirety.

TECHNICAL FIELD

The present invention relates to a detector, and more particularly, a detector including a frequency multiplier generating an output signal by injection pulling.

BACKGROUND

In general, a detector detecting the status of displacement of an object by the Doppler effect requires a high frequency input signal from an oscillation source operated at a high frequency to update the status of displacement of the object. Since it is difficult to process a high frequency signal with a digital process, an analog process is usually used to process the signal. Therefore, the signal is affected by flicker noise easily, the signal noise ratio (SNR) is reduced seriously, and the difficulty of subsequent digital signal processing (DSP) is increased. Furthermore, since the oscillation source is operated at a high frequency (e.g. around 10 GHz) which cannot be decreased, the power consumption of the oscillation source cannot be decreased easily. A solution with lower power consumption and smaller effect by flicker noise is required in this field.

SUMMARY

An embodiment of the present invention discloses a detector including an oscillation source, a frequency multiplier, a transceiver and a demodulator. The oscillation source is used to generate a first injection signal having a first frequency. The frequency multiplier includes a first injection terminal, an output terminal and a second injection terminal. The first injection terminal is coupled to the oscillation source, and used to receive the first injection signal. The output terminal is used to output an output signal. The second injection terminal is used to receive a second injection signal having a second frequency. The frequency multiplier outputs the output signal at a frequency equal to a multiple of the first frequency by injection locking, and pulls the output signal to the second frequency by injection pulling. The transceiver is coupled to the output terminal and the second injection terminal of the frequency multiplier, and used to transmit the output signal, and receive a received signal having a third frequency. The received signal is used to update the second injection signal. The demodulator is coupled to the output terminal of the frequency multiplier, and used to perform a demodulation operation so as to generate a displacement signal according to the output signal.

Another embodiment of the present invention discloses a frequency multiplier includes a first injection terminal, an output terminal and a second injection terminal. The first injection terminal is used to receive a first injection signal having a first frequency. The output terminal is used to output an output signal. The second injection terminal is used to receive a second injection signal having a second frequency. The frequency multiplier outputs the output signal at a frequency equal to a multiple of the first frequency by injection locking, and pulls the output signal to the second frequency by injection pulling.

DETAILED DESCRIPTION

Figure 1:
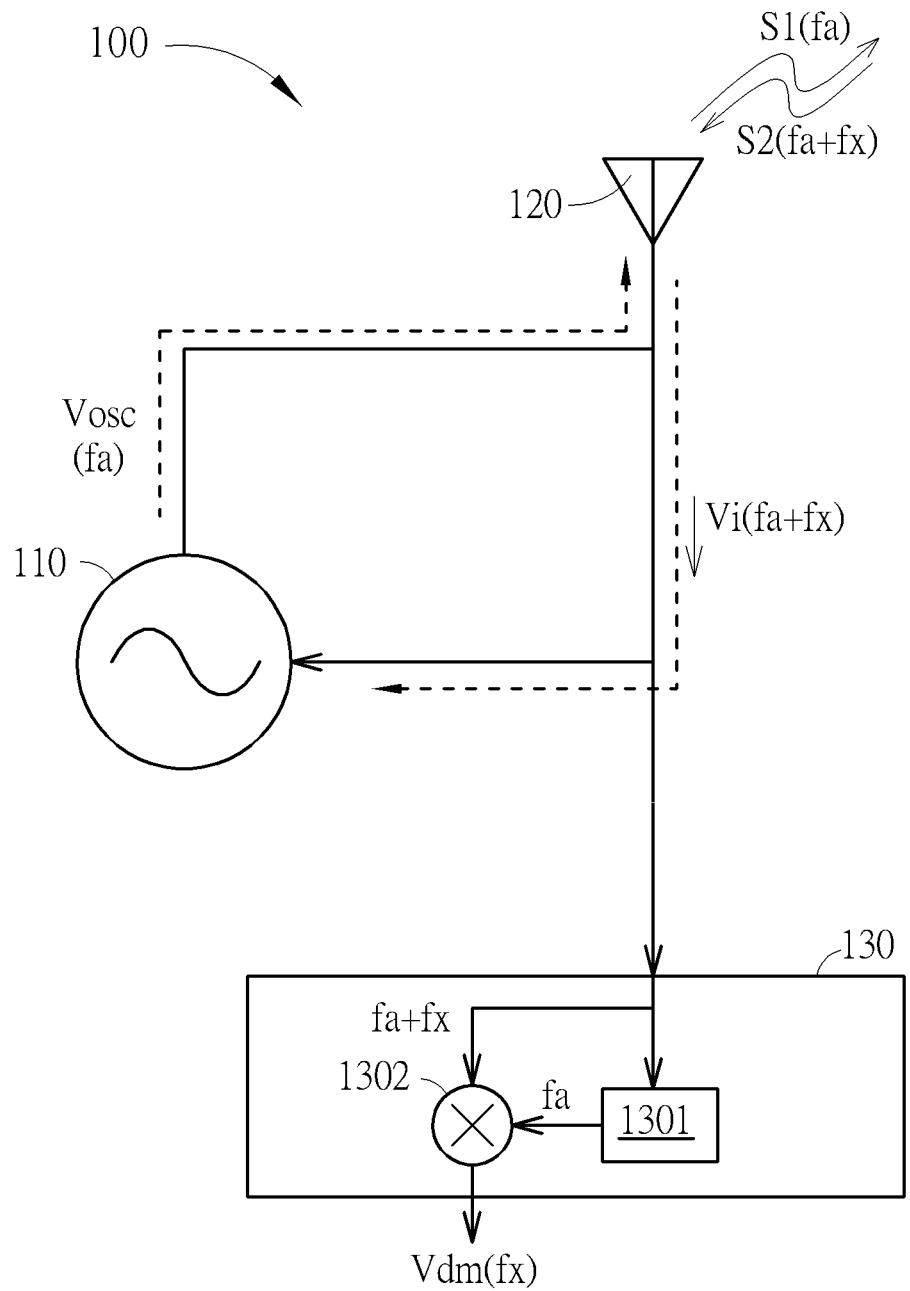
FIG. 1 illustrates a detector according to an embodiment of the present invention.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

FIG. 1 illustrates a detector 100 according to an embodiment of the present invention. The detector 100 includes an oscillation source 110, an antenna 120 and a demodulator 130. The demodulator 130 includes a delay 1301 and a frequency mixer 1302. The oscillation source 110 generates an output signal Vosc with a frequency fa at beginning so that the antenna 120 may transmit a detection signal S1 with the frequency fa outward. When the detection signal S1 detects a detected object, a reflection signal S2 is reflected back and received by the antenna 120, and an input signal Vi is generated accordingly and sent to the oscillation source 110 and the demodulator 130. The reflection signal S2 has a frequency (fa+fx), so the difference between the frequency (fa+fx) of the reflection signal S2 and the frequency fa of the detection signal S1 is a frequency fx. The input signal Vi has the frequency (fa+fx) according to the reflection signal S2. The frequency fx is determined by the Doppler effect. The frequency fx is a positive value when the detected object moves toward the detector 100, and the frequency fx is a negative value when the detected object moves away from the detector 100. The frequency fx may be updated according to the status of displacement of the detected object. When the input signal Vi is input into the demodulator 130, an analog process is used since the frequency (fa+fx) of the input signal Vi is high (e.g. 10 GHz±150 Hz). The demodulator 130 may perform FM demodulation so as to generate a demodulated signal Vdm, and then obtain information of the displacement of the detected object according to the demodulated signal Vdm. The delay 1301 and the frequency mixer 1302 are used to obtain the frequency fx bringing information of displacement of the detected object. The demodulated signal Vdm may be a voltage signal and processed in voltage domain. Since the demodulated signal Vdm is approximately a signal of with zero frequency, it is easily affected by flicker noise so as to decrease SNR and increase the difficulty of subsequent digital process.

Figure 2:
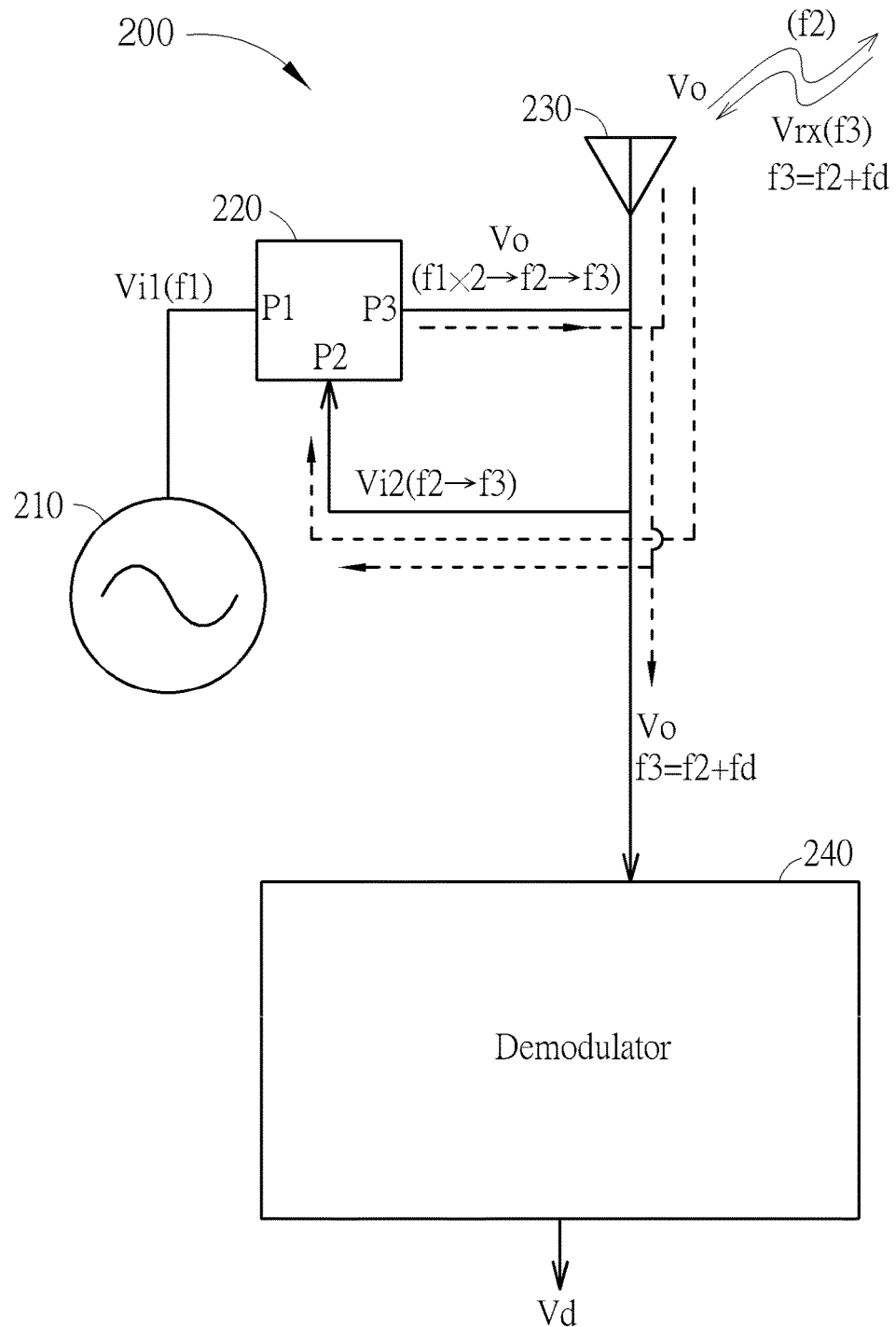
FIG. 2 illustrates a detector according to another embodiment of the present invention.

FIG. 2 illustrates a detector 200 according to another embodiment of the present invention. The detector 200 includes an oscillation source 210, a frequency multiplier 220, a transceiver 230 and a demodulator 240. The oscillation source is used to generate an injection signal Vi1 having a frequency f1. The frequency multiplier 220 includes injection terminals P1 and P2, and an output terminal P3. The injection terminal P1 is coupled to the oscillation source 210, and used to receive the injection signal Vi1. The output terminal P3 is used to output an output signal Vo. The injection terminal P2 is used to receive an injection signal Vi2 having a frequency f2. The frequency multiplier 220 may output the output signal Vo at a frequency equal to a multiple of the frequency f1 (e.g. 2/1, 3/1, etc.) by injection locking, and pulls the output signal Vo to the frequency f2 by injection pulling. The frequency multiplier 220 may be a double, triple or n-times frequency multiplier, where n is a positive integer. The transceiver 230 is coupled to the output terminal P3 and the injection terminal P2 of the frequency multiplier 220, and used to transmit the output signal Vo, and receive a received signal Vrx having a frequency f3. The received signal Vrx is used to update the injection signal Vi2. The demodulator 240 is coupled to the output terminal P3 of the frequency multiplier 220, and used to perform a demodulation operation so as to generate a displacement signal Vd according to the output signal Vo. The displacement signal Vd may be an analog signal or a digital signal.

For example, if the injection signal Vi2 has the frequency f2 (e.g. (10 G+300) Hz), the frequency of the output signal Vo may be pulled from the double of the frequency f1 (e.g. 5 G Hz), that is (f1×2) (e.g. 10 GHz), to the frequency f2 (e.g. to (10 G+300) Hz from 10 G Hz) by injection pulling. The transceiver 230 (e.g. an antenna) may transmit the output signal Vo having the frequency f2 (e.g. (10 G+300) Hz) outward. When detecting a detected object (e.g. a vehicle), the received signal Vrx may be reflected to the transceiver 230. The received signal Vrx may have the frequency f3. The relation of the frequency f3 of the received signal Vrx and the frequency f2 of the output signal Vo may be described by following equation α:

$$f3=f2+fd \quad (\alpha);$$

The frequency fd may be a difference frequency generated by the Doppler effect. The difference frequency fd may be positive if the detected object is moving forward the detector 200, and the difference frequency fd may be negative if the detected object is moving away from the detector 200. After the transceiver 230 receives the received signal Vrx having the frequency f3 (i.e. (f2+fd), for example, if fd is 100 Hz, and f2 is (10 G+300) Hz, f3 may be (10 G+300+100) Hz, that is (10 G+400) Hz), the received signal Vrx (e.g. with a frequency of (10 G+400) Hz) may be used to update the injection signal Vi2. Hence, the frequency of the injection signal Vi2 may be updated from the frequency f2 (e.g. (10 G+300) Hz) to the frequency f3 (e.g. (10 G+400) Hz). After the injection signal Vi2 is updated to the frequency f3 (e.g. (10 G+400) Hz), the output signal Vo may be pulled to the frequency f3 (e.g. (10 G+400) Hz) at the frequency multiplier 220 by injection pulling. The demodulator 240 may perform demodulation operation according to the frequency f3 (i.e. f2+fd) to generate the displacement signal Vd corresponding to the difference between the frequencies f2 and f3, that is the frequency fd. The status of the displacement of the detected object may be determined according to the displacement signal Vd. Comparing with the oscillation source 110 operated at a high frequency (e.g. 10 G Hz) in the previous embodiment, the operation frequency of the oscillation source 210 of the embodiment illustrated by FIG. 2 may be decreased to 50% or even lower according to the multiplier of the frequency multiplier 220, and power consumption may be effectively reduced. Furthermore, since the demodulation operation of the embodiment of the present invention is performed at an intermediate frequency instead of a zero frequency, the harmful effect of flicker noise can be better prevented as described below.

Figure 3:
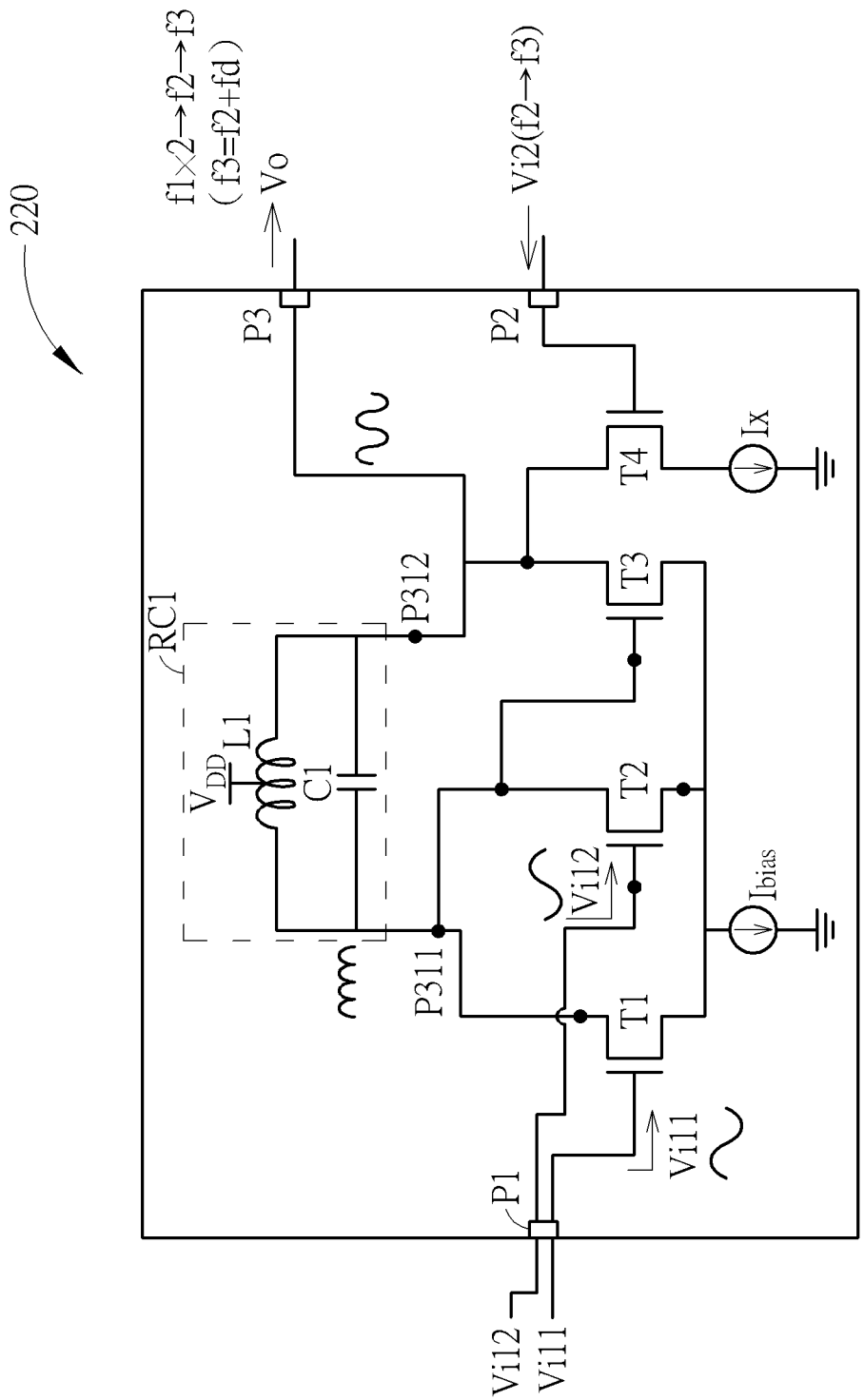
FIG. 3 illustrates the frequency multiplier in FIG. 2 according to an embodiment of the present invention.

FIG. 3 illustrates the frequency multiplier 220 according to an embodiment of the present invention. The frequency multiplier 220 includes a resonant circuit RC1 and transistors T1, T2, T3 and T4. The resonant circuit RC1 may be a tank circuit operated at a multiple (e.g. double) of the frequency f1, and includes at least a capacitor C1, at least an inductor L1, a first terminal P311, and a second terminal P312 coupled the output terminal P3 of the frequency multiplier 220. The inductor L1 may be coupled to a voltage source $V_{DD}$ according to an embodiment. The transistor T1 includes a gate terminal coupled to the injection terminal P1 and used to receive a first phase portion Vi11 of the injection signal Vi1, a first terminal coupled to the first terminal P311 of the resonant circuit RC1, and a second terminal coupled to a bias current source $I_{bias}$. The transistor T2 includes a gate terminal coupled to the injection terminal P1 and used to receive a second phase portion Vi12 of the injection signal Vi1, a first terminal coupled to the first terminal P311 of the resonant circuit RC1, and a second terminal coupled to the bias current source $I_{bias}$. The transistor T3 includes a gate terminal coupled to the first terminal P311 of the resonant circuit RC1, a first terminal coupled to the second terminal P312 of the resonant circuit RC1, and a second terminal coupled to the bias current source $I_{bias}$. The transistor T4 includes a gate terminal coupled to the injection terminal P2 and used to receive the injection signal Vi2, a first terminal coupled to the second terminal P312 of the resonant circuit RC1, and a second terminal coupled to a current source Ix. According to an embodiment of the present invention, the current source Ix and the bias current source $I_{bias}$ may be of an identical current source. FIG. 3 may be one of the designs of the frequency multiplier 220 rather than being used to limit the internal structure of the frequency multiplier 220, and a designer may adjust the internal circuit of the frequency multiplier 220 according to requirement of the product.

Figure 4:
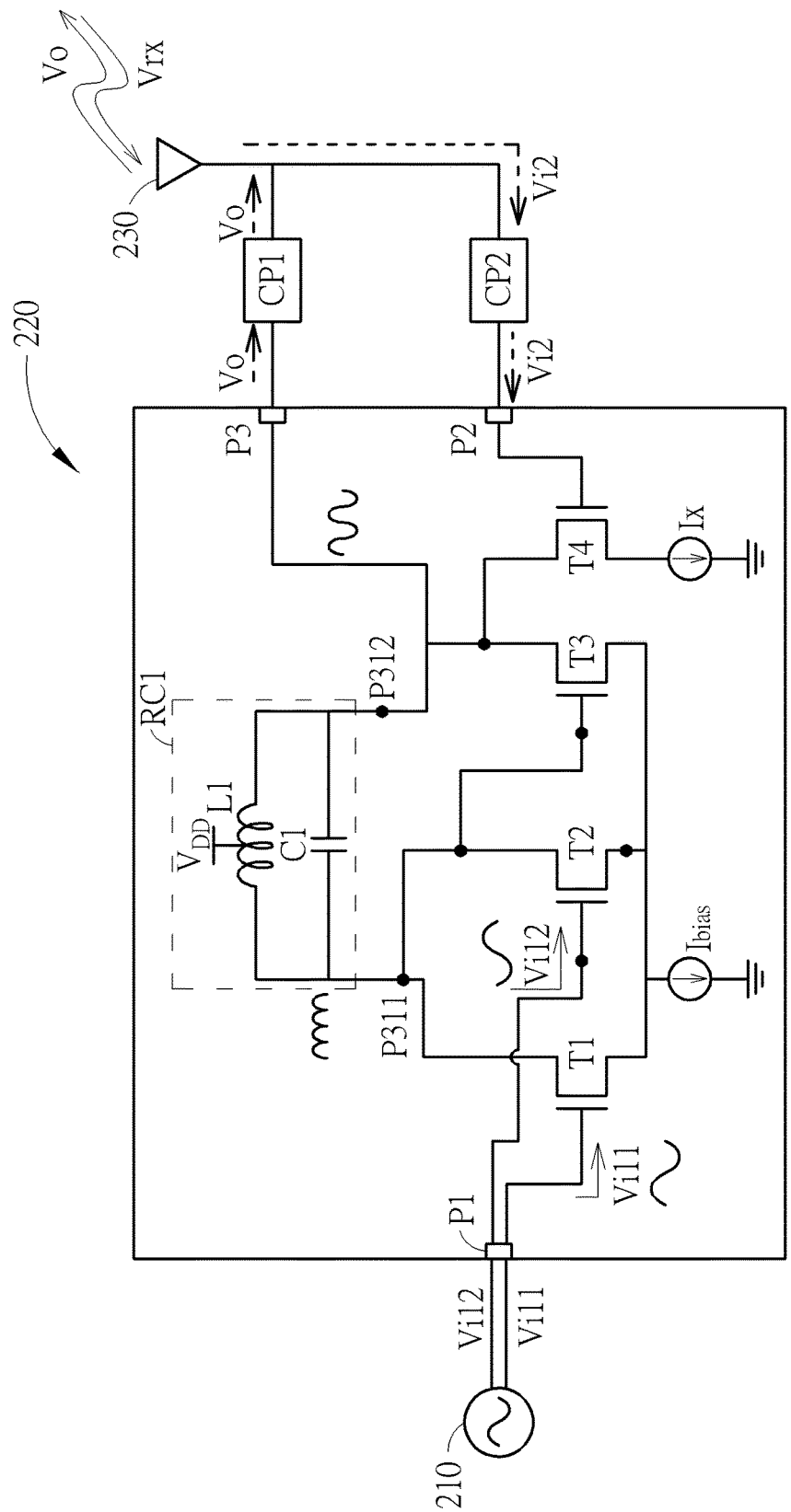
FIG. 4 illustrates that the frequency multiplier of FIG. 3 is coupled to the oscillation source and transceiver according to an embodiment of the present invention.

FIG. 4 illustrates that the frequency multiplier 220 of FIG. 3 is coupled to the oscillation source 210 and transceiver 230 according to an embodiment of the present invention. According to FIG. 4, since the injection signal Vi1 is formed by the first phase portion Vi11 and second phase portion Vi12, the signals Vi11 and Vi12 may be input to the transistors T1 and T2 respectively. According to another embodiment, if the injection signal Vi1 is a single signal, an inverter may be coupled to the gate terminal of the transistor T2 so as to obtain a signal with a reversed phase of the injection signal Vi1. According to embodiment shown in FIG. 4, a coupling unit CP1 may be disposed between the transceiver 230 and the output terminal P3 of the frequency multiplier 220, and another coupling unit CP2 may be disposed between and the transceiver 230 and the injection terminal P2 of the frequency multiplier 220. The coupling unit CP1/CP2 may include a power amplifier, a low noise amplifier and/or a capacitor. A designer may determine whether to dispose the coupling unit CP1 and/or the coupling unit CP2, and determine the sort of the coupling unit CP1/CP2 according to design requirement or result of measurement so as to improve the effect of detection. For example, a smaller capacitor may be chosen for signals of higher frequency.

Figure 5:
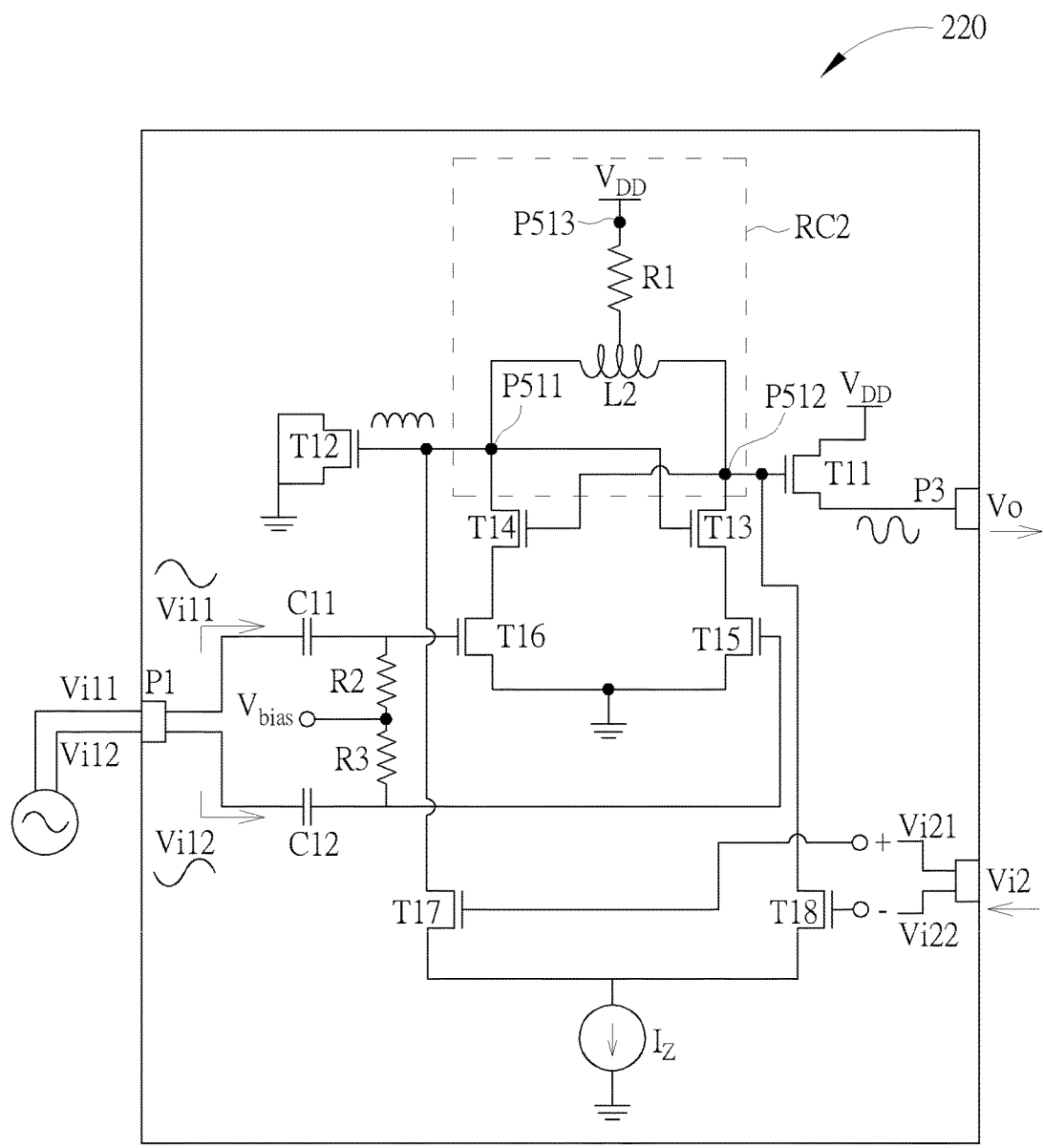
FIG. 5 illustrates the frequency multiplier in FIG. 2 according to another embodiment of the present invention.

FIG. 5 illustrates the frequency multiplier 220 according to another embodiment of the present invention. The frequency multiplier 220 may include a resonant circuit RC2, transistors T11-T18, resistors R2-R3 and capacitors C11-C12. The resonant circuit RC2 may be operated at a multiple of the frequency f1, and includes a resistor R1, an inductor L2, a voltage terminal P513 coupled to a voltage source $V_{DD}$, a first terminal P511 and a second terminal P512. The voltage terminal P513 may couple to the middle of the inductor L2 through the resistor R1. The transistor T11 may include a gate terminal coupled to the second terminal P512 of the resonant circuit RC2, a first terminal coupled to the voltage source $V_{DD}$, and a second terminal coupled to the output terminal P3 of the frequency multiplier 220. The transistor T12 may include a gate terminal coupled to the first terminal P511 of the resonant circuit RC2, a first terminal coupled to a ground terminal, and a second terminal coupled to the ground terminal. The transistor T13 may include a gate terminal coupled to the first terminal P511 of the resonant circuit RC2, a first terminal coupled to the second terminal P512 of the resonant circuit RC2, and a second terminal. The transistor T14 may include a gate terminal coupled to the second terminal P512 of the resonant circuit RC2, a first terminal coupled to the first terminal P511 of the resonant circuit RC2, and a second terminal. The transistor T15 may include a gate terminal, a first terminal coupled to the second terminal of the transistor T13, and a second terminal coupled to the ground terminal. The transistor T16 may include a gate terminal, a first terminal coupled to the second terminal of the transistor T14, and a second terminal coupled to the second terminal of the transistor T15 and the ground terminal. The resistor R2 may include a first terminal coupled to the gate terminal of the transistor T16, and a second terminal coupled to a bias voltage source $V_{bias}$. The resistor R3 may include a first terminal coupled to the bias voltage source $V_{bias}$, and a second terminal coupled to the gate terminal of the transistor T15. The capacitor C11 may include a first terminal coupled to the injection terminal P1 and used to receive the first phase portion Vi11 of the injection signal Vi1, and a second terminal coupled to the first terminal of the resistor R1. The capacitor C12 may include a first terminal coupled to the injection terminal P1 and used to receive the second phase portion Vi12 of the injection signal Vi1, and a second terminal coupled to the gate terminal of the transistor T15. The transistor T17 may include a first terminal coupled to the gate terminal of the transistor T12, a gate terminal coupled to the injection terminal P2 and used to receive the injection signal Vi2, and a second terminal coupled to a current source Iz. The transistor T18 includes a first terminal coupled to the gate terminal of the transistor T11, a gate terminal coupled to the second injection terminal P2 and configured to receive the second injection signal Vi2, and a second terminal coupled to the current source Iz. The current source Iz may be coupled to the ground terminal. According to an embodiment of the present invention, the gate terminal of the transistor T17 may be used to receive a first phase portion Vi21 of the injection signal Vi2, and the gate terminal of the transistor T18 may be used to receive a second phase portion Vi22 of the injection signal Vi2.

Figure 6:
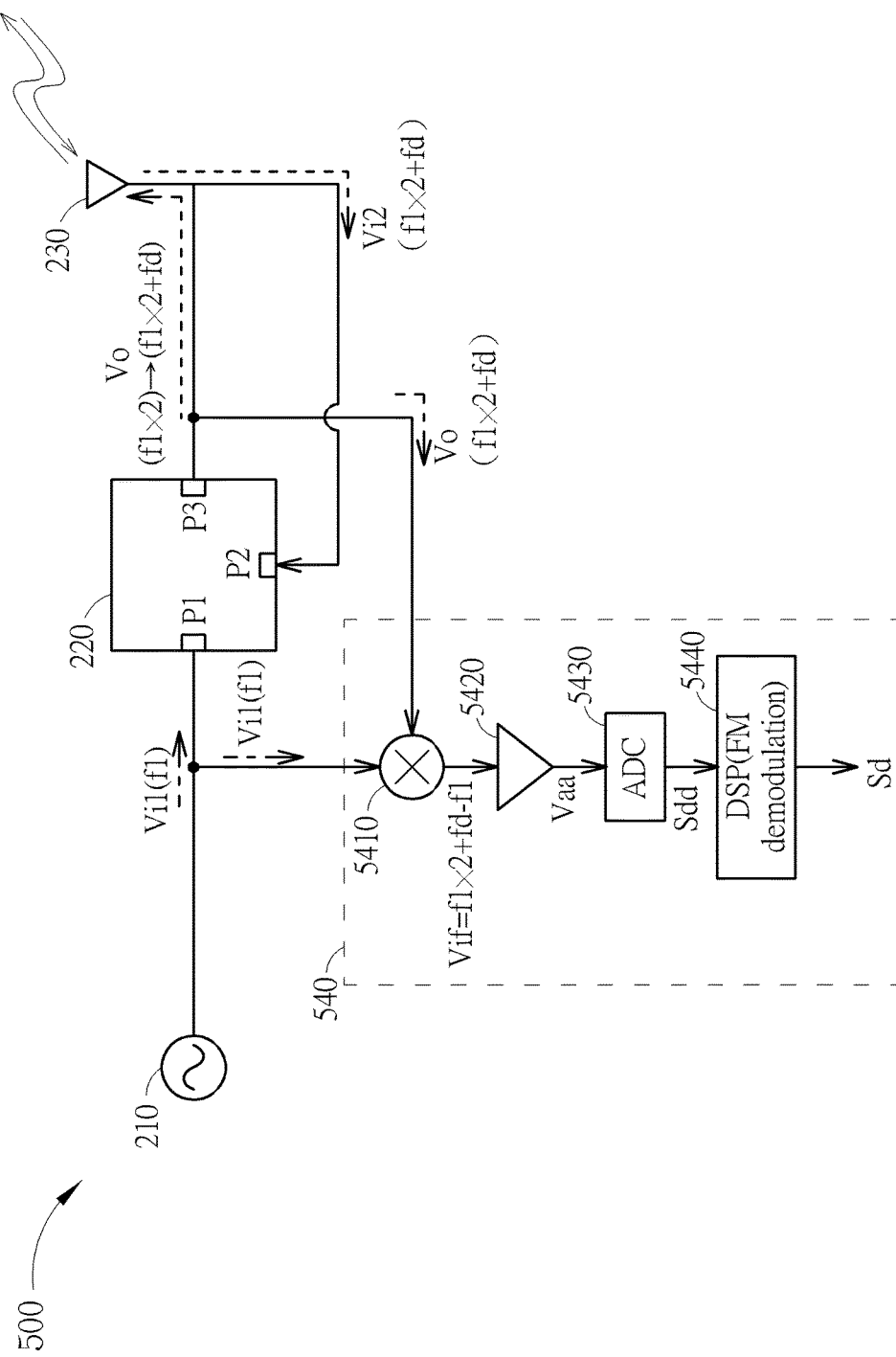
FIG. 6 illustrates a detector according to another embodiment of the present invention.

FIG. 6 illustrates a detector 500 according to another embodiment of the present invention. The detector 500 may include the oscillation source 210, the frequency multiplier 220, the transceiver 230 and a demodulator 540. The demodulator 540 may include a frequency mixer 5410, an amplifier 5420, an analog-to-digital converter (ADC) 5430 and a digital signal processor (DSP) 5440. The frequency mixer 5410 may include a mixer, be coupled to the injection terminal P1 and the output terminal P3 of the frequency multiplier 220, and be used to mix frequencies of the injection signal Vi1 and the output signal Vo to generate an intermediate frequency (IF) signal Vif. The amplifier 5420 may include a voltage amplifier and/or a current amplifier, be coupled to the frequency mixer 5410, and used to amplify the intermediate frequency signal Vif so as to generate an analog signal Vaa. The analog-to-digital converter 5430 may be coupled to the amplifier 5420 and used to convert the analog signal Vaa to a digital signal Sdd. The digital signal processor 5440 may be coupled to the analog-to-digital converter 5430 and used to demodulate the digital signal Sdd so as to generate the displacement signal Sd. The digital signal processor 5440 may perform FM (frequency modulation) demodulation. The displacement signal Sd may correspond to the status of displacement of the detected object, and the displacement signal Sd may be a digital signal.

For example, if the frequency multiplier 220 of FIG. 6 is a double multiplier, the injection signal Vi1 has the frequency f1 (e.g. 5 G Hz), and the output signal Vo is pulled by injection pulling so as to have a frequency as (f1×2+fd), that is twice the frequency f1 plus the difference frequency fd generated by the Doppler effect, the frequency of the intermediate frequency signal Vif outputted by the frequency mixer 5410 may be shown as the equation β:

$$\text{The frequency of the intermediate frequency signal } Vif = \qquad (\beta).$$
$$\text{The frequency of the output signal } Vo -$$
$$\text{The frequency of the injection signal } Vi1 =$$
$$(f1 \times 2 + fd) - f1 = f1 + fd \ldots .$$

The frequency f1 as 5 G Hz, and the difference frequency fd generated by the Doppler effect triggered by the movement of the detected object as 150 Hz may be taken for example. Regarding the input signal Vi processed by the demodulator 130 in FIG. 1, the frequency of the input signal Vi may be (fa+fx), that is (10 G+150) Hz for example, hence it is known that the frequency of the intermediate frequency signal Vif (e.g. (5 G+150) Hz) may be of an intermediate frequency and with much lower frequency than the input signal Vi processed by the demodulator 130 shown in FIG. 1. Hence, in the embodiment of FIG. 6, the intermediate frequency signal Vif may be processed by using a digital process, and is allowed to be amplified, converted from analog to digital and processed with DSP without being FM demodulated first. Hence, the amplifier 5420 generating the analog signal Vaa, and the analog-to-digital converter 5430 generating the digital signal Sdd may be performed in frequency domain. Since none of the analog signal Vaa and the digital signal Sdd is an approximate zero frequency signal, the demodulator 540 is difficult to be affected by flicker noise. When the digital signal processor 5440 generates the displacement signal Sd, the FM demodulation is performed. Comparing FIG. 6 with FIG. 1, it is known that the frequency of the processed signal may be reduced at the front-end (e.g. the frequency mixer 5410) in the embodiment of FIG. 6 so that the intermediate frequency signal may be processed by a digital process, and the reduction of SNR caused by flicker noise may be prevented.

Figure 7:
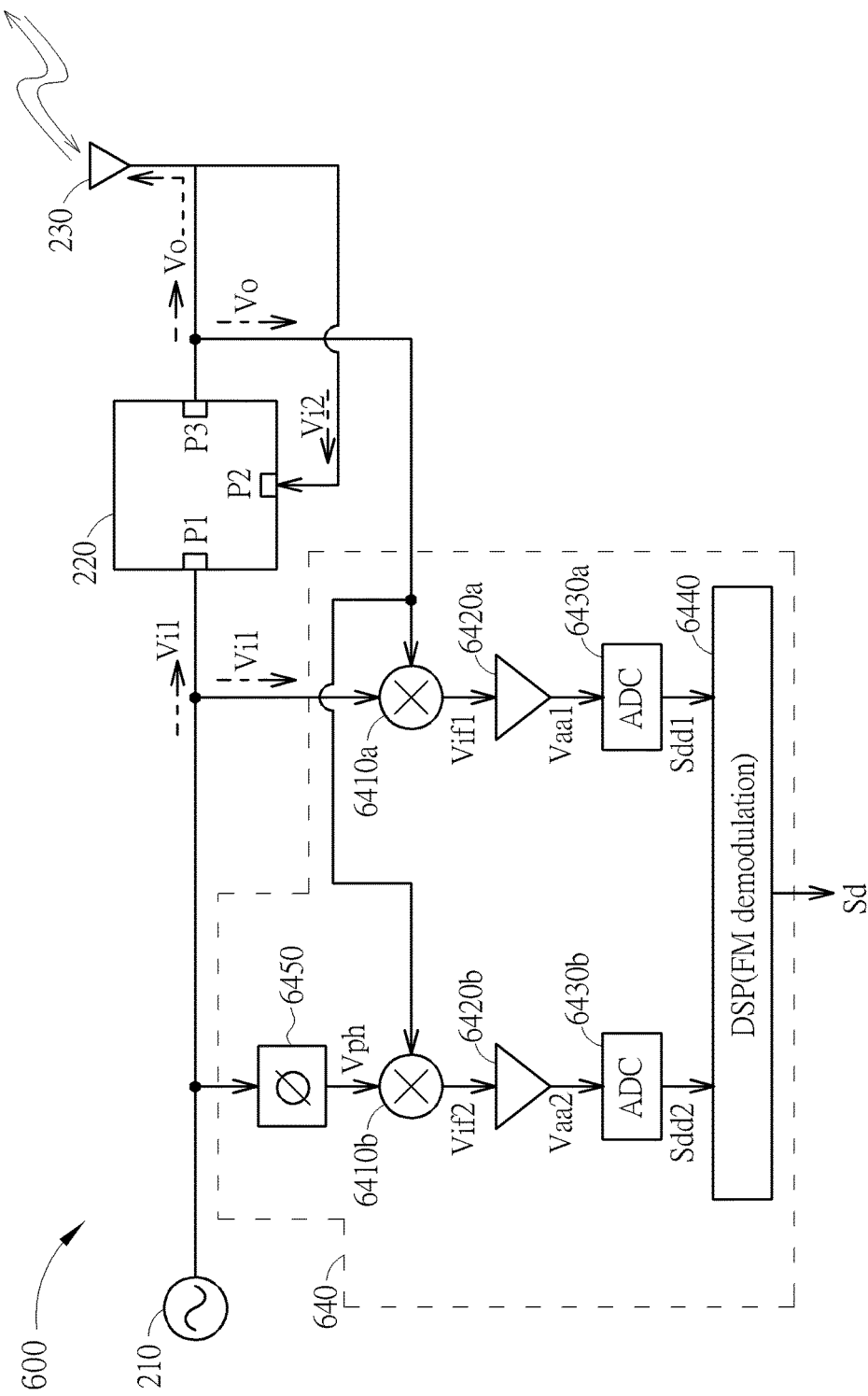
FIG. 7 illustrates a detector according to another embodiment of the present invention.

FIG. 7 illustrates a detector 600 according to another embodiment of the present invention. A demodulator 640 of the detector 600 may include frequency mixers 6410a and 6410b, amplifiers 6420a and 6420b, analog-to-digital converters 6430a and 6430b, a phase adjustment unit 6450 and a digital signal processor 6440. The frequency mixer 6410a may be coupled to the injection terminal P1 and the output terminal P3 of the frequency multiplier 220, and be used to mix frequencies of the injection signal Vi1 and the output signal Vo to generate an intermediate frequency signal Vif1. The amplifier 6420a may be coupled to the frequency mixer 6410a and be used to amplify the intermediate frequency signal Vif1 to generate an analog signal Vaa1. The analog-to-digital converter 6430a may be coupled to the amplifier 6420a and be used to convert the analog signal Vaa1 to a digital signal Sdd1. The phase adjustment unit 6450 may be coupled to the oscillation source 210 and be used to receive the injection signal Vi1 and adjust a phase of the injection signal Vi1 (e.g. by shifting 90 degrees) so as to generate a phase shift signal Vph. The frequency mixer 6410b may be coupled to the phase adjustment unit 6450 and the output terminal P3 of the frequency multiplier 220, and be used to mix frequencies of the phase shift signal Vph and the output signal Vo to generate an intermediate frequency signal Vif2. The amplifier 6420b may be coupled to the frequency mixer 6410b and be used to amplify the intermediate frequency signal Vif2 to generate an analog signal Vaa2. The analog-to-digital converter 6430b may be coupled to the amplifier 6420b and be used to convert the analog signal Vaa2 to a digital signal Sdd2. The digital signal processor 6440 may be coupled to the analog-to-digital converters 6430a and 6430b, and be used to demodulate the digital signals Sdd1 and Sdd2 so as to generate the displacement signal Sd. In FIG. 7, the demodulator 640 with a dual-path structure may support dual-path signals such as I-Q signals. For example, the frequency mixer 6410a, the amplifier 6420a and the analog-to-digital converter 6430a may be used to process the I-signal, and the frequency mixer 6410b, the amplifier 6420b and the analog-to-digital converter 6430b may be used to process the Q-signal. Since the I-signal is different from the Q-signal (e.g. the I-Q signals being of a sine waveform and a cosine waveform respectively), blind zones led by standing waves may be avoided. The structure shown in FIG. 7 with the dual-path structure may support I-Q signals to improve a demodulation performance.

Figure 8:
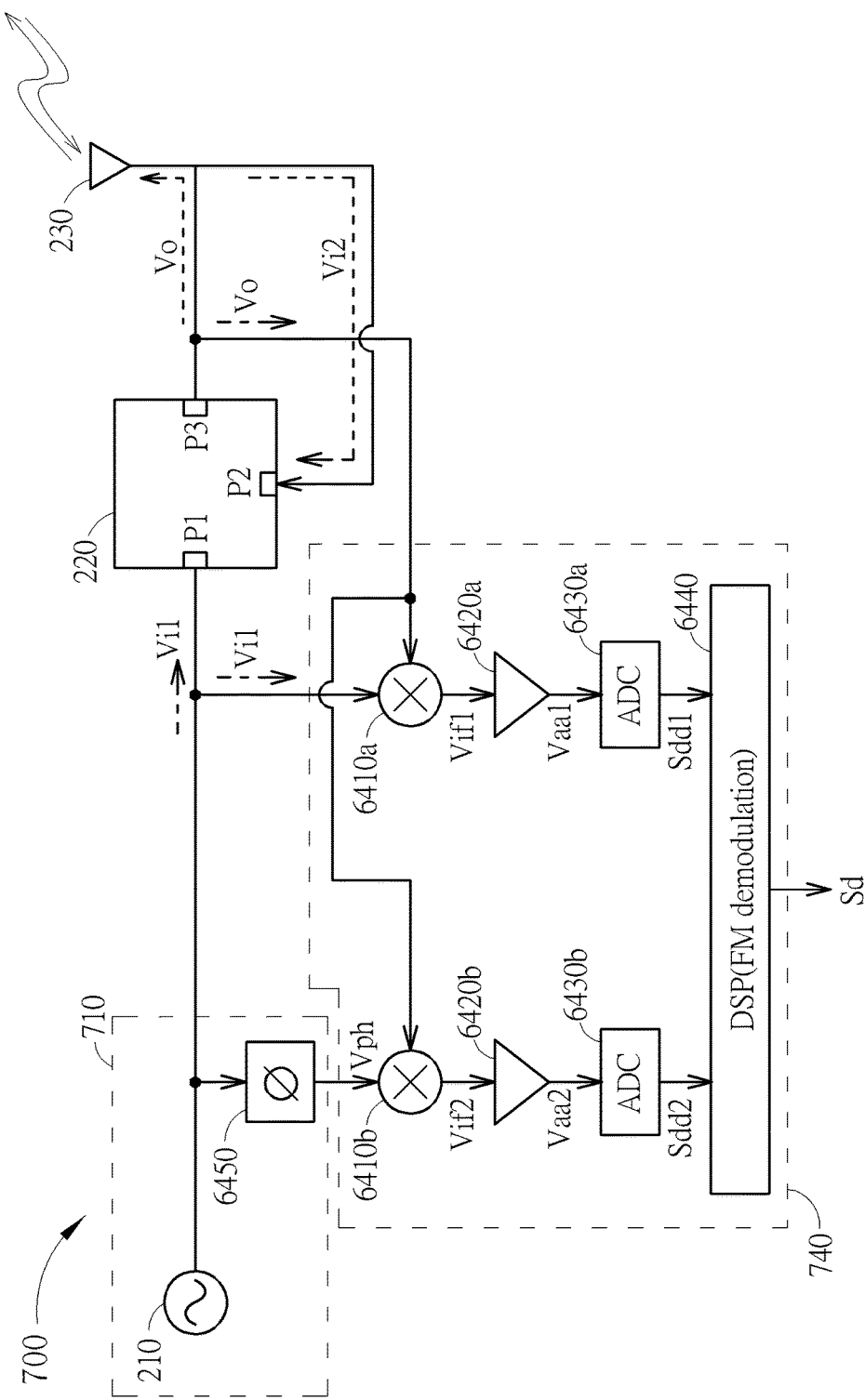
FIG. 8 illustrates a detector according to another embodiment of the present invention.

FIG. 8 illustrates a detector 700 according to another embodiment of the present invention. The detector 700 may include an oscillation source 710, a frequency multiplier 220, a transceiver 230 and a demodulator 740. The demodulator 740 may include the frequency mixers 6410a and 6410b, the amplifiers 6420a and 6420b, the analog-to-digital converters 6430a and 6430b, and the digital signal processor 6440. Different from the demodulator 640 of FIG. 7, the demodulator 740 may not include the phase adjustment unit 6450. The oscillation source 710 may output the injection signal Vi1 having the frequency f1 and the phase shift signal Vph generated by adjusting the phase of the injection signal Vi1 (e.g. shifting the phase of the injection signal Vi1 by 90 degrees). The operations of the frequency mixers 6410a and 6410b, the amplifiers 6420a and 6420b, the analog-to-digital converters 6430a and 6430b, and the digital signal processor 6440 may be as described in FIG. 7, and are not repeated herein. The oscillation source 710 providing two signals with different phases may be required in the detector 700, and dual-path signals such as I-Q signals may be supported to improve a demodulation performance.

Figure 9:
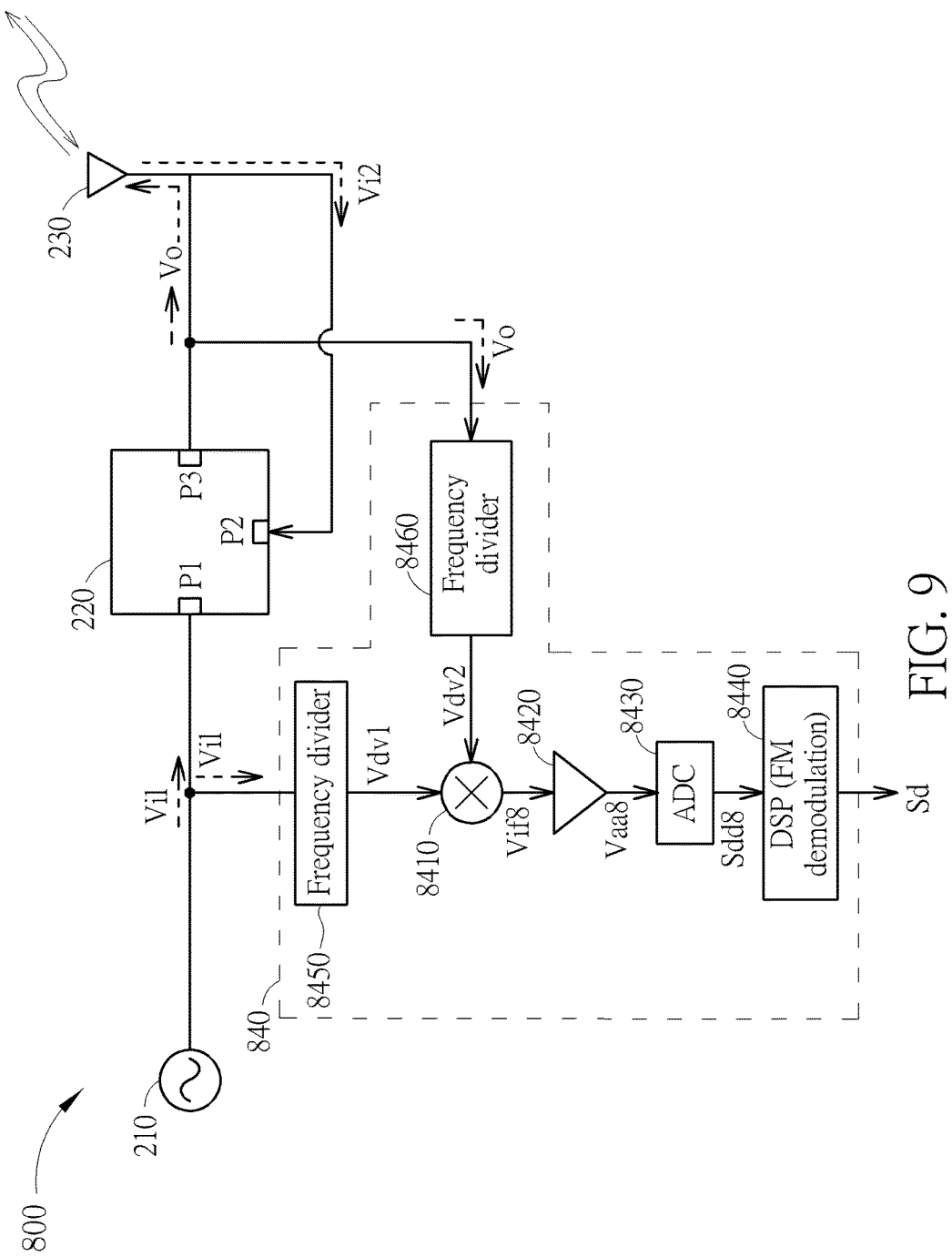
FIG. 9 illustrates a detector according to another embodiment of the present invention.

FIG. 9 illustrates a detector 800 according to an embodiment of the present invention. The detector 800 may include the oscillation source 210, the frequency multiplier 220, the transceiver 230 and a demodulator 840. The operations of the oscillation source 210, the frequency multiplier 220 and the transceiver 230 may be as described above, and are not repeated herein. The demodulator 840 includes frequency dividers 8450 and 8460, a frequency mixer 8410, an amplifier 8420, an analog-to-digital converter 8430 and a digital signal processor 8440. The frequency divider 8450 may be coupled to the oscillation source 210 and be used to divide frequency of the injection signal Vi1 so as to generate a frequency-divided signal Vdv1. The frequency divider 8460 may be coupled to the output terminal P3 of the frequency multiplier 220, and be used to divide frequency of the output signal Vo so as to generate a frequency-divided signal Vdv2. The frequency mixer 8410 may be coupled to the frequency dividers 8450 and 8460, and be used to mix frequencies of the frequency-divided signals Vdv1 and Vdv2 so as to generate an intermediate frequency signal Vif8. The amplifier 8420 may be coupled to the frequency mixer 8410 and be used to amplify the intermediate frequency signal Vif8 so as to generate an analog signal Vaa8. The analog-to-digital converter 8430 may be coupled to the amplifier 8420 and be used to convert the analog signal Vaa8 to a digital signal Sdd8. The digital signal processor 8440 may be coupled to the analog-to-digital converter 8430 and be used to demodulate the digital signal Sdd8 so as to generate the displacement signal Sd.

The frequency divider 8450 may perform frequency division with a divisor X, and the frequency divider 8460 may perform frequency division with a divisor Y. Suppose the frequency of the injection signal Vi1 is 5 G Hz, the frequency of the output signal Vo is 10 G Hz, the divisor X is 4 and the divisor Y is 9, the frequency of the intermediate frequency signal Vif8 may be described as the equation γ.

$$\begin{aligned}\text{The frequency of the intermediate frequency signal } Vif8 = \\ |(\text{frequency of the output signal } Vo) \div Y - \\ (\text{frequency of the injection signal } Vi1) \div X| = \\ |10G \text{ Hz} \div 9 - 5G \text{ Hz} \div 4| = 139 \text{ M Hz} \dots \,.\end{aligned} \quad (\gamma).$$

Hence, the frequency of the intermediate frequency Vif8 may be reduced to be relatively low so as to be easily processed by a digital signal process. The intermediate frequency Vif8 may be processed by the amplifier 8420 and the analog-to-digital converter 8430, and then be FM demodulated when being processed by the digital signal processor 8440. Since the intermediate frequency Vif8 may not be processed approximately at a zero frequency, the detector 800 may not be affected by flicker noise easily.

Figure 10:
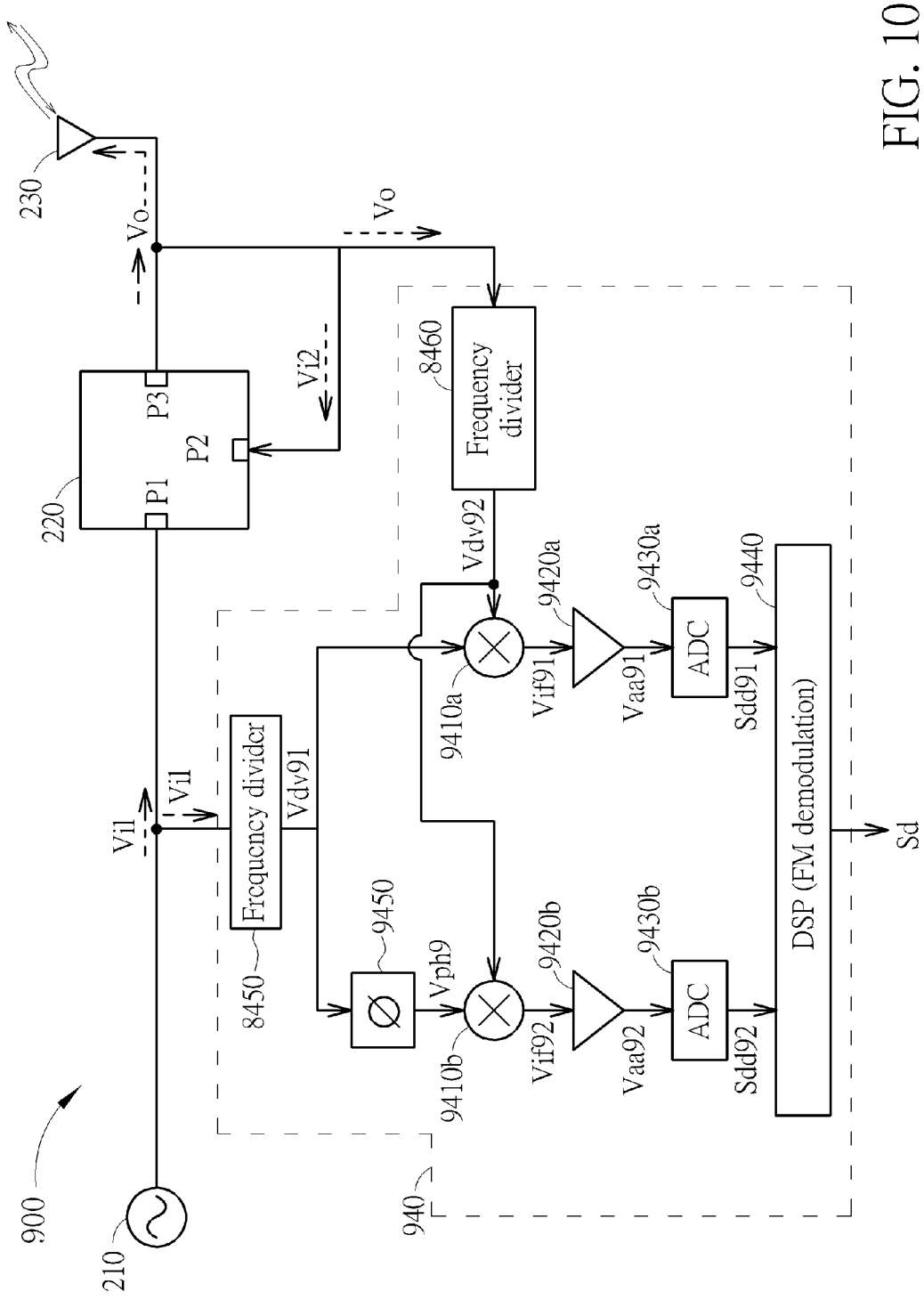
FIG. 10 illustrates a detector according to another embodiment of the present invention.

FIG. 10 illustrates a detector 900 according to another embodiment of the present invention. The detector 900 may include the oscillation source 210, the frequency multiplier 220, the transceiver 230 and a demodulator 940. The operations of the oscillation source 210, the frequency multiplier 220 and the transceiver 230 may be as described above, so are not repeated herein. The demodulator 940 may include the frequency dividers 8450 and 8460, frequency mixers 9410a and 9410b, amplifiers 9420a and 9420b, analog-to-digital converters 9430a and 9430b, a phase adjustment unit 9450, and a digital signal processor 9440. The frequency divider 8450 may be coupled to the oscillation source 210 and used to divide frequency of the injection signal Vi1 so as to generate a frequency-divided signal Vdv91. The frequency divider 8460 may be coupled to the output terminal P3 of the frequency multiplier 220 and used to divide frequency of the output signal Vo so as to generate a frequency-divided signal Vdv92. The frequency mixer 9410a may be coupled to the frequency dividers 8450 and 8460, and used to mix frequencies of the frequency-divided signals Vdv91 and Vdv92 so as to generate an intermediate frequency signal Vif91. The amplifier 9420a may be coupled to the frequency mixer 9410a and used to amplify the intermediate frequency signal Vif91 so as to generate an analog signal Vaa91. The analog-to-digital converter 9430a may be coupled to the amplifier 9420a and used to convert the analog signal Vaa91 to a digital signal Sdd91. The phase adjustment unit 9450 may be coupled to the frequency divider 8450 and used to receive the frequency-divided signal Vdv91 and adjust a phase of the frequency-divided signal Vdv91 so as to generate a phase shift signal Vph9. The frequency mixer 9410b may be coupled to the phase adjustment unit 9450 and the frequency divider 8460, and used to mix frequencies of the phase shift signal Vph9 and the frequency-divided signal Vdv92 so as to generate an intermediate frequency signal Vif92. The amplifier 9420b may be coupled to the frequency mixer 9410b and used to amplify the intermediate frequency signal Vif92 so as to generate an analog signal Vaa92. The analog-to-digital converter 9430b may be coupled to the amplifier 9420b and used to convert the analog signal Vaa92 to a digital signal Sdd92. The digital signal processor 9440 may be coupled to the analog-to-digital converters 9430a and 9430b, and used to demodulate the digital signals Sdd91 and Sdd92 so as to generate the displacement signal Sd. Similar to the detector 800, since the detector 900 includes the frequency dividers 8450 and 8460, the intermediate frequency signals processed by the detector 900 such as the intermediate frequency signals Vif91 and Vif92 may be of relatively low frequency (e.g. 130 MHz), it is easier to be processed by a digital signal process. FM demodulation may be not performed before the signals are sent to the amplifiers and analog-to-digital converters, so the effect of flicker noise may be avoided. Similar to the detector 500, since the detector 900 has a dual-path structure, it may support dual-path signals such as I-Q signals for a better effect of the demodulation.

Figure 11:
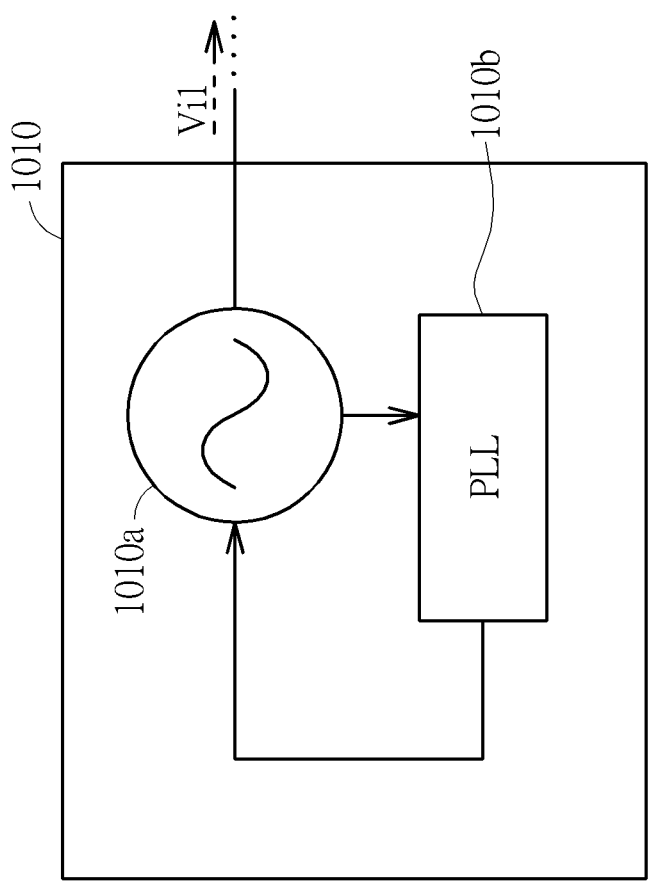
FIG. 11 illustrates an oscillation source in FIG. 2 according to an embodiment of the present invention.

FIG. 11 illustrates an oscillation source 1010 according to an embodiment of the present invention. The oscillation sources of the detectors mentioned above may be replaced by the oscillation source 1010. The oscillation source 1010 may include an oscillator 1010a and a phase-locked loop 1010b. If the oscillator 1010a is analog type, the phase-locked loop 1010b may be analog type. If the oscillator 1010a is digital type, the phase-locked loop 1010b may be digital type. The phase-locked loop 1010b may increase the stability of the frequency of the output signal from the oscillation source 1010 without being affected by temperature or supplied voltage. The detector may therefore be more suitable for accurate applications and communication regulations.

In summary, the detectors disclosed by embodiments of the present invention may avoid the interference made by flicker noise so that the signal-to-noise ratio may not be reduced. Furthermore, the operation frequency of the oscillation sources used in the detectors disclosed by embodiments of the present invention may be decreased greatly, so the power consumption may be decreased. The shortcomings of low signal-to-noise ratio and high power consumption of the detectors of prior art may be effectively improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A detector comprising:
an oscillation source configured to generate a first injection signal having a first frequency;
a frequency multiplier comprising:
a first injection terminal coupled to the oscillation source, and configured to receive the first injection signal;
an output terminal configured to output an output signal; and
a second injection terminal configured to receive a second injection signal having a second frequency;
wherein the frequency multiplier outputs the output signal at a frequency equal to a multiple of the first frequency by injection locking, and pulls the output signal to the second frequency by injection pulling;
a transceiver coupled to the output terminal and the second injection terminal of the frequency multiplier, and configured to transmit the output signal, and receive a received signal having a third frequency, wherein the received signal is configured to update the second injection signal; and
a demodulator coupled to the output terminal of the frequency multiplier, and configured to perform a demodulation operation so as to generate a displacement signal according to the output signal.

2. The detector of claim 1, wherein the frequency multiplier further comprises:
a resonant circuit operated at a multiple of the first frequency, and comprising a capacitor, an inductor, a first terminal, and a second terminal coupled the output terminal of the frequency multiplier;
a first transistor comprising a gate terminal coupled to the first injection terminal and configured to receive a first phase portion of the first injection signal, a first terminal coupled to the first terminal of the resonant circuit, and a second terminal configured to couple to a bias current source;
a second transistor comprising a gate terminal coupled to the first injection terminal and configured to receive a second phase portion of the first injection signal, a first terminal coupled to the first terminal of the resonant circuit, and a second terminal configured to couple to the bias current source;
a third transistor comprising a gate terminal coupled to the first terminal of the first transistor, a first terminal coupled to the second terminal of the resonant circuit, and a second terminal coupled to the bias current source; and
a fourth transistor comprising a gate terminal coupled to the second injection terminal and configured to receive the second injection signal, a first terminal coupled to the second terminal of the resonant circuit, and a second terminal configured to couple to a current source.

3. The detector of claim 2, wherein the current source and the bias current source are of an identical current source.

4. The detector of claim 1, wherein the frequency multiplier further comprises:
   a resonant circuit operated at a multiple of the first frequency, and comprising a first resistor, an inductor, a voltage terminal configured to couple to a voltage source, a first terminal, and a second terminal;
   a first transistor comprising a gate terminal coupled to the second terminal of the resonant circuit, a first terminal, and a second terminal coupled to the output terminal of the frequency multiplier;
   a second transistor comprising a gate terminal coupled to the first terminal of the resonant circuit, a first terminal coupled to a ground terminal, and a second terminal configured to couple to the ground terminal;
   a third transistor comprising a gate terminal coupled to the first terminal of the resonant circuit, a first terminal coupled to the second terminal of the resonant circuit, and a second terminal;
   a fourth transistor comprising a gate terminal coupled to the second terminal of the resonant circuit, a first terminal coupled to the first terminal of the resonant circuit, and a second terminal;
   a fifth transistor comprising a gate terminal, a first terminal coupled to the second terminal of the third transistor, and a second terminal configured to couple to the ground terminal;
   a sixth transistor comprising a gate terminal, a first terminal coupled to the second terminal of the fourth transistor, and a second terminal coupled to the second terminal of the fifth transistor and configured to couple to the ground terminal;
   a second resistor comprising a first terminal coupled to the gate terminal of the sixth transistor, and a second terminal configured to couple to a bias voltage source;
   a third resistor comprising a first terminal configured to couple to the bias voltage source, and a second terminal coupled to the gate terminal of the fifth transistor;
   a first capacitor comprising a first terminal coupled to the first injection terminal and configured to receive a first phase portion of the first injection signal, and a second terminal coupled to the first terminal of the second resistor;
   a second capacitor comprising a first terminal coupled to the first injection terminal and configured to receive a second phase portion of the first injection signal, and a second terminal coupled to the gate terminal of the fifth transistor;
   a seventh transistor comprising a first terminal coupled to the gate terminal of the second transistor, a gate terminal coupled to the second injection terminal and configured to receive the second injection signal, and a second terminal configured to couple to a current source; and
   an eighth transistor comprising a first terminal coupled to the gate terminal of the first transistor, a gate terminal coupled to the second injection terminal and configured to receive the second injection signal, and a second terminal configured to couple to the current source.

5. The detector of claim 4, wherein the gate terminal of the seventh transistor is configured to receive a first phase portion of the second injection signal, and the gate terminal of the eighth transistor is configured to receive a second phase portion of the second injection signal.

6. The detector of claim 1, further comprising:
   a coupling unit disposed between the transceiver and the output terminal of the frequency multiplier, or between the second injection terminal and the transceiver;
   wherein the coupling unit comprises a power amplifier, a low noise amplifier and/or a capacitor.

7. The detector of claim 1, wherein the demodulator comprises:
   a frequency mixer coupled to the first injection terminal and the output terminal of the frequency multiplier, and configured to mix frequencies of the first injection signal and the output signal to generate an intermediate frequency signal;
   an amplifier coupled to the frequency mixer and configured to amplify the intermediate frequency signal so as to generate an analog signal;
   an analog-to-digital converter coupled to the amplifier and configured to convert the analog signal to a digital signal; and
   a digital signal processor coupled to the analog-to-digital converter and configured to demodulate the digital signal so as to generate the displacement signal.

8. The detector of claim 1, wherein the demodulator comprises:
   a first frequency mixer coupled to the first injection terminal and the output terminal of the frequency multiplier, and configured to mix frequencies of the first injection signal and the output signal to generate a first intermediate frequency signal;
   a first amplifier coupled to the first frequency mixer and configured to amplify the first intermediate frequency signal to generate a first analog signal;
   a first analog-to-digital converter coupled to the first amplifier and configured to convert the first analog signal to a first digital signal;
   a phase adjustment unit coupled to the oscillation source and configured to receive the first injection signal and adjust a phase of the first injection signal so as to generate a phase shift signal;
   a second frequency mixer coupled to the phase adjustment unit and the output terminal of the frequency multiplier, and configured to mix frequencies of the phase shift signal and the output signal to generate a second intermediate frequency signal;
   a second amplifier coupled to the second frequency mixer and configured to amplify the second intermediate frequency signal to generate a second analog signal;
   a second analog-to-digital converter coupled to the second amplifier and configured to convert the second analog signal to a second digital signal; and
   a digital signal processor coupled to the first analog-to-digital converter and the second analog-to-digital converter, and configured to demodulate the first digital signal and the second digital signal so as to generate the displacement signal.

9. The detector of claim 1, wherein the oscillation source is further configured to generate a phase shift signal generated by adjusting a phase of the first injection signal, and the demodulator comprises:
   a first frequency mixer coupled to the first injection terminal and the output terminal of the frequency multiplier, and configured to mix frequencies of the first injection signal and the output signal to generate a first intermediate frequency signal;

a first amplifier coupled to the first frequency mixer and configured to amplify the first intermediate frequency signal so as to generate a first analog signal;

a first analog-to-digital converter coupled to the first amplifier and configured to convert the first analog signal to a first digital signal;

a second frequency mixer coupled to the oscillation source and the output terminal of the frequency multiplier, and configured to mix frequencies of the phase shift signal and the output signal so as to generate a second intermediate frequency signal;

a second amplifier coupled to the second frequency mixer and configured to amplify the second intermediate frequency signal so as to generate a second analog signal;

a second analog-to-digital converter coupled to the second amplifier and configured to convert the second analog signal to a second digital signal; and a digital signal processor coupled to the first analog-to-digital converter and the second analog-to-digital converter, and configured to demodulate the first digital signal and the second digital signal so as to generate the displacement signal.

10. The detector of claim 1, wherein the demodulator comprises:

a first frequency divider coupled to the oscillation source and configured to divide frequency of the first injection signal so as to generate a first frequency-divided signal;

a second frequency divider coupled to the output terminal of the frequency multiplier and configured to divide frequency of the output signal so as to generate a second frequency-divided signal;

a frequency mixer coupled to the first frequency divider and the second frequency divider, and configured to mix frequencies of the first frequency-divided signal and the second frequency-divided signal so as to generate an intermediate frequency signal;

an amplifier coupled to the frequency mixer and configured to amplify the intermediate frequency signal so as to generate an analog signal;

an analog-to-digital converter coupled to the amplifier and configured to convert the analog signal to a digital signal; and a digital signal processor coupled to the analog-to-digital converter and configured to demodulate the digital signal so as to generate the displacement signal.

11. The detector of claim 1, wherein the demodulator comprises:

a first frequency divider coupled to the oscillation source and configured to divide frequency of the first injection signal so as to generate a first frequency-divided signal;

a second frequency divider coupled to the output terminal of the frequency multiplier and configured to divide frequency of the output signal so as to generate a second frequency-divided signal;

a first frequency mixer coupled to the first frequency divider and the second frequency divider, and configured to mix frequencies of the first frequency-divided signal and the second frequency-divided signal so as to generate a first intermediate frequency signal;

a first amplifier coupled to the first frequency mixer and configured to amplify the first intermediate frequency signal so as to generate a first analog signal;

a first analog-to-digital converter coupled to the first amplifier and configured to convert the first analog signal to a first digital signal;

a phase adjustment unit coupled to the first frequency divider and configured to receive the first frequency-divided signal and adjust a phase of the first frequency-divided signal so as to generate a phase shift signal;

a second frequency mixer coupled to the phase adjustment unit and the second frequency divider, and configured to mix frequencies of the phase shift signal and the second frequency-divided signal so as to generate a second intermediate frequency signal;

a second amplifier coupled to the second frequency mixer and configured to amplify the second intermediate frequency signal so as to generate a second analog signal;

a second analog-to-digital converter coupled to the second amplifier and configured to convert the second analog signal to a second digital signal; and a digital signal processor coupled to the first analog-to-digital converter and the second analog-to-digital converter, and configured to demodulate the first digital signal and the second digital signal so as to generate the displacement signal.

12. The detector of claim 1, wherein the oscillation source comprises a phase-locked loop configured to improve stability of the first injection signal.

13. A detector comprising:

a frequency multiplier comprising:
   a first injection terminal configured to receive a first injection signal having a first frequency;
   an output terminal configured to output an output signal; and
   a second injection terminal configured to receive a second injection signal having a second frequency;
   wherein the frequency multiplier outputs the output signal at a frequency equal to a multiple of the first frequency by injection locking, and pulls the output signal to the second frequency by injection pulling; and a transceiver coupled to the output terminal and the second injection terminal of the frequency multiplier, and configured to transmit the output signal, and receive a received signal having a third frequency, wherein the received signal is configured to update the second injection signal for generating a displacement signal.

* * * * *